United States Patent
He et al.

(10) Patent No.: US 12,206,397 B2
(45) Date of Patent: Jan. 21, 2025

(54) POWER SWITCHING CIRCUITRY WITH FEEDBACK CONTROL

(71) Applicant: Apple Inc., Cupertino, CA (US)

(72) Inventors: Yueming He, San Jose, CA (US); Dennis M Fischette, Jr., Mountain View, CA (US)

(73) Assignee: Apple Inc., Cupertino, CA (US)

( * ) Notice: Subject to any disclaimer, the term of this patent is extended or adjusted under 35 U.S.C. 154(b) by 136 days.

(21) Appl. No.: 17/949,454

(22) Filed: Sep. 21, 2022

(65) Prior Publication Data
US 2024/0097672 A1    Mar. 21, 2024

(51) Int. Cl.
*H03K 17/16*    (2006.01)
*H03K 19/003*    (2006.01)

(52) U.S. Cl.
CPC ..... *H03K 17/167* (2013.01); *H03K 19/00361* (2013.01)

(58) Field of Classification Search
CPC ...... H03K 17/12; H03K 17/122; H03K 17/16; H03K 17/164; H03K 17/167; H03K 19/003; H03K 19/00346; H03K 19/00361; G06F 1/26; G11C 7/1048
See application file for complete search history.

(56) References Cited

U.S. PATENT DOCUMENTS

| | | | |
|---|---|---|---|
| 5,351,162 A * | 9/1994 | Koishikawa | H03K 17/08122 361/18 |
| 6,445,245 B1 * | 9/2002 | Schultz | H03K 19/0005 327/543 |
| 6,934,141 B2 | 8/2005 | Hamano et al. | |
| 6,963,218 B1 * | 11/2005 | Alexander | H03K 17/167 326/26 |
| 7,276,932 B2 * | 10/2007 | Kuang | H03K 19/0016 326/35 |
| 7,737,720 B2 * | 6/2010 | Idgunji | H03K 19/0016 327/547 |
| 8,035,938 B2 | 10/2011 | Divan | |
| 8,074,086 B1 | 12/2011 | Sancheti et al. | |
| 8,738,940 B2 | 5/2014 | Venkatraman et al. | |
| 9,281,758 B1 | 3/2016 | Wang et al. | |
| 9,553,483 B2 | 1/2017 | Wang et al. | |
| 10,620,676 B1 * | 4/2020 | Tejada | G06F 1/26 |
| 10,665,296 B1 * | 5/2020 | Wu | G11C 7/16 |
| 11,150,677 B2 * | 10/2021 | Yasusaka | G05F 1/56 |
| 2005/0116753 A1 * | 6/2005 | Martelloni | H03K 19/0016 327/170 |

(Continued)

*Primary Examiner* — Jason M Crawford
(74) *Attorney, Agent, or Firm* — Treyz Law Group; Jason Tsai

(57) ABSTRACT

An integrated circuit may be provided with power switching circuitry. The power switching circuitry may include a primary power switch and multiple auxiliary power switches. A power gating control circuit may output control signals for selectively activating the primary power switch and at least one of the auxiliary power switches to charge a gated voltage. One or more voltage detectors may be configured to monitor the gated voltage and to activate the remaining auxiliary power switches in response to detecting that the gated voltage exceeds one or more thresholds. Configured and operated in this way, inrush current surge protection can be achieved while charging up the gated voltage sufficiently fast.

20 Claims, 7 Drawing Sheets

(56) References Cited

U.S. PATENT DOCUMENTS

| | | | |
|---|---|---|---|
| 2009/0115258 A1* | 5/2009 | Flynn | H03K 19/0016 |
| | | | 307/129 |
| 2013/0088278 A1* | 4/2013 | Spalding, Jr. | G05F 1/468 |
| | | | 327/401 |
| 2014/0009134 A1 | 1/2014 | Bernardon et al. | |
| 2018/0013294 A1* | 1/2018 | Edelson | H03K 17/162 |
| 2018/0145676 A1* | 5/2018 | Tran | H03K 19/017509 |
| 2023/0369972 A1* | 11/2023 | Zhou | H02M 3/155 |
| 2024/0097672 A1* | 3/2024 | He | H03K 17/167 |

* cited by examiner

POWER SWITCHING CIRCUITRY WITH FEEDBACK CONTROL

FIELD

Embodiments described herein relate generally to integrated circuits and, more particularly, to integrated circuits with a power switching circuit.

BACKGROUND

Integrated circuits often include a power switching circuit for reducing inrush current when turning on the power. Conventional power switching circuits typically include a single small power switch that is turned on to charge an internal power supply voltage to 90% of an externally supplied voltage. The small power switch needs to be small enough to limit the inrush current but also large enough to charge up the internal power supply within a specified time period.

It can be challenging to design a power switching circuit to meet these competing requirements. It is within this context that the embodiments herein arise.

SUMMARY

An electronic device may include an integrated circuit having power switching circuitry with feedback control. The power switching circuitry may be configured to limit inrush current while being able to charge an internal gated voltage up towards the positive power supply level within a certain period of time. The power switching circuitry can include a primary power switch coupled to an output node, a first auxiliary power switch coupled to the output node, a second auxiliary power switch coupled to the output node, and a voltage detection circuit configured to monitor a voltage at the output node and to selectively activate the second auxiliary power switch based on the monitored voltage. The first and second auxiliary power switches are each smaller than the primary power switch.

The primary power switch comprises a first pull-up transistor having a first source-drain terminal coupled to a positive power supply line, a second source-drain terminal coupled to the output node, and a gate terminal configured to receive a first control signal. The first auxiliary power switch comprises a second pull-up transistor having a first source-drain terminal coupled to the positive power supply line, a second source-drain terminal coupled to the output node, and a gate terminal configured to receive a second control signal. The second auxiliary power switch comprises a third pull-up transistor having a first source-drain terminal coupled to the positive power supply line, a second source-drain terminal coupled to the output node, and a gate terminal configured to receive a third control signal. A power gating control circuit can be used to output the first and second control signals, whereas the third control signal is output from the voltage detection circuit. The voltage detection circuit can receive an inverted version of the second control signal via an inverter. The voltage detection circuit can activate the second auxiliary power switch in response to detecting that the voltage at the output node exceeds a threshold.

A method of operating power switching circuitry is also provided. The method can include activating a first auxiliary power switch to charge up a gated voltage, detecting whether the gated voltage exceeds a threshold, activating a second auxiliary power switch to charge up the gated voltage in response to detecting the gated voltage exceeding the threshold, and activating a primary power switch to charge the gated voltage to a positive power supply voltage subsequent to activating the second auxiliary power switch. The method can further include using a voltage detector to detect whether the gated voltage exceeds the threshold and using the voltage detector to output a control signal to the second auxiliary power switch. The method can further include using power gating control logic to output a first control signal to the primary power switch, to output a second control signal to the first auxiliary power switch, and to assert the first control signal a fixed delay period after assertion of the second control signal.

An aspect of the disclosure provides circuitry that includes a primary power switch configured to charge a gated voltage, a first auxiliary power switch configured to charge the gated voltage, a second auxiliary power switch configured to charge the gated voltage, a third auxiliary power switch configured to charge the gated voltage, a first voltage detector configured to activate the second auxiliary power switch, and a second voltage detector configured to activate the third auxiliary power switch. The first voltage detector can be configured to activate the second auxiliary power switch in response to detecting that the gated voltage exceeds a first threshold, whereas the second voltage detector can be configured to activate the third auxiliary power switch in response to detecting that the gated voltage exceeds a second threshold different than the first threshold. The circuitry can optionally further include a fourth auxiliary power switch configured to charge up the gate voltage and a third voltage detector configured to activate the fourth auxiliary power switch, where the first, second, third, and fourth auxiliary power switches are activated at different times.

Further features of the invention, its nature and various advantages will be more apparent from the accompanying drawings and following detailed description.

DETAILED DESCRIPTION

This relates to an integrated circuit having power switching circuitry. Such integrated circuit can be included within any type of electronic device or system, including but not limited to a cellular telephone, a tablet computer, a wristwatch, a laptop computer, a desktop computer, a monitor, a display with one or more displays, a media player, a digital content streaming device, a charger, an earbud, a headphone, a speaker, a stylus, a keyboard, an accessory, a wearable device, a head-mounted device, an automobile, or other electronic systems. The power switching circuitry can include circuits for limiting inrush current while quickly charging up an internal power supply voltage for a wide range of electronic applications. Inrush current can refer to and be defined herein as the maximum instantaneous input current drawn by an integrated circuit when it is first powered on. Inrush current is sometimes referred to as an input current surge or a power-on current surge.

The power switching circuitry can include a primary (big) power switch and multiple auxiliary (smaller) power switches. The auxiliary power switches should be small enough to limit the in-rush current to satisfy desired inrush current requirements. When an integrated circuit device is first powered on, one of the auxiliary power switches can be turned on. The activated auxiliary power switch can charge up an internal (gated) power supply voltage. The gated power supply voltage is sometimes referred to as a virtual power supply voltage. A voltage sensor can be used to detect, via a feedback path, when the gated power supply voltage exceeds a certain threshold. In response to detecting that the gated power supply voltage exceeds the threshold, the remaining auxiliary power switch(es) can be turned on to charge the gated power supply voltage up to at least 90% of the target positive power supply voltage. Thereafter, the primary power switch can be turned on to complete the charging process. Configured and operated using this feedback control mechanism, the power switching circuitry can simultaneously satisfy inrush current requirements while being able to quickly charge up the gated power supply voltage within a prescribed time period across a wide range of operating conditions.

Figure 1:
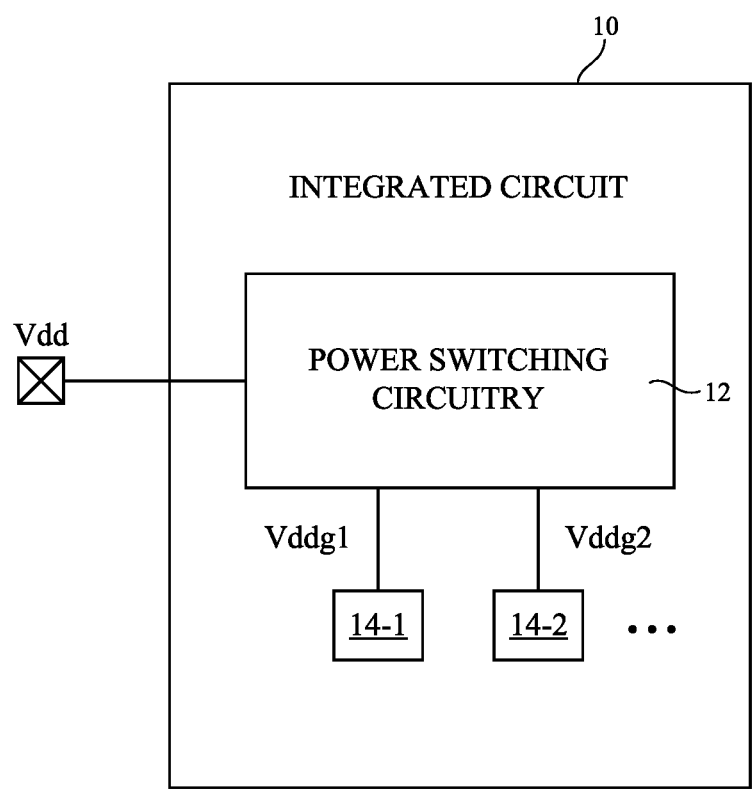
FIG. 1 is a diagram of an illustrative integrated circuit having power switching circuitry in accordance with some embodiments.

FIG. 1 is a diagram of an illustrative integrated circuit device such as integrated circuit 10 that can include power switching circuitry 12. Integrated circuit 10 can represent one or more processors such as a microprocessor, a microcontroller, a digital signal processor, a host processor, a baseband processor, an application processor, a central processing unit (CPU), a graphics processing unit (GPU), a power management integrated circuit (PMIC), a field-programmable gate array or programmable logic device, a sound (audio) chip, a wireless communications processor such as a radio-frequency transceiver chip, a combination of these circuits, or other types of integrated circuits.

As shown in FIG. 1, power switching circuitry 12 may have an input configured to receive an externally supplied power supply voltage such as external power supply voltage Vdd. Based on the external power supply voltage Vdd, power switching circuitry 12 can provide a power gating function for selectively outputting one or more power-gated voltages such as Vddg1 that is provided to a first group of circuits 14-1 on device 10 and Vddg2 that is provided to a second group of circuits 14-2 on device 10. Voltages Vddg1 and Vddg2 can sometimes be referred to herein as internal power supply voltages or gated power supply voltages.

The internal circuit components such as circuits 14-1 and 14-2 can include digital circuit components, analog circuit components, mixed-signal circuit components, the same type of circuit components, different types of circuit components, active circuit components, passive circuit components, and any electronic component(s). The example of FIG. 1 in which power switching circuitry 12 is used to provide at least two gated power supply voltages Vddg1 and Vddg2 to two different groups of internal circuit components is merely illustrative. In general, power switching circuitry 12 can be configured to generate only one gated power supply voltage to a corresponding group of circuits, three or more gated power supply voltages to at least three different groups of circuits, or any number of gated (internal) power supply voltages.

Figure 2:
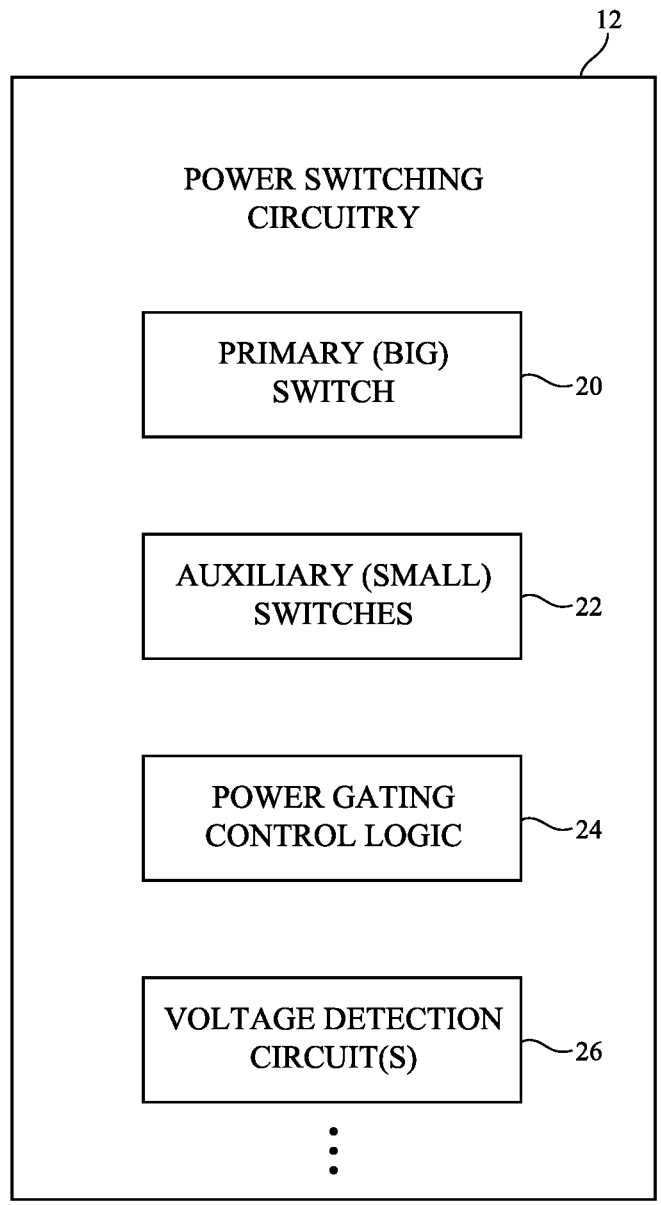
FIG. 2 is a block diagram of illustrative power switching circuitry in accordance with some embodiments.

FIG. 2 is a block diagram of illustrative power switching circuitry 12. As shown in FIG. 2, power switching circuitry 12 may include a primary power switch such as primary switch 20, multiple auxiliary power switches such as auxiliary switches 22, a power gating control logic such as power gating controller 24, and one or more voltage detection circuits such as voltage detector 26. Primary power switch 20 may be larger than each of the auxiliary power switches 22. As such, primary power switch 20 is sometimes referred to as the "big" power switch, whereas auxiliary power switches 22 can be referred to as the "small" or secondary power switches. For example, the primary power switch 22 may be at least 10 times the size of each auxiliary power switch 22, at least 20 times the size of each auxiliary power switch 22, 20-50 times the size of each auxiliary power switch 22, at least 50-100 times the size of each auxiliary power switch 22, or more than 100× larger than the size of each auxiliary power switch 22. Each of the auxiliary power switches 22 should be small enough to limit the inrush current to meet design criteria.

The power gating controller 24 may be configured to output control signals for selectively activating primary power switch 20 and at least one of the auxiliary power switches 22. Power gating controller 24 may output a first control signal for activating primary power switch 20 and may output a second control signal for activating the at least one of the auxiliary power switches 22. Using power gating controller 24 to assert the second control signal enables the activated auxiliary power switch 22 to pull (charge) up an internal/gated power supply voltage. Voltage detector 26 may monitor the gated power supply voltage via a feedback path. Responsive to sensing that the gated power supply voltage exceeds a predetermined threshold level, voltage detector 26 may then activate additional auxiliary power switches 22 to help pull up the gated power supply voltage at a faster rate. Configured and operated in this way, power switching circuitry 12 is able to provide both adequate inrush current surge protection and sufficient charging speed. If desired, power switching circuitry 12 may include additional circuit components for facilitating the requisite inrush protection and power supply voltage charging operations.

Figure 3:
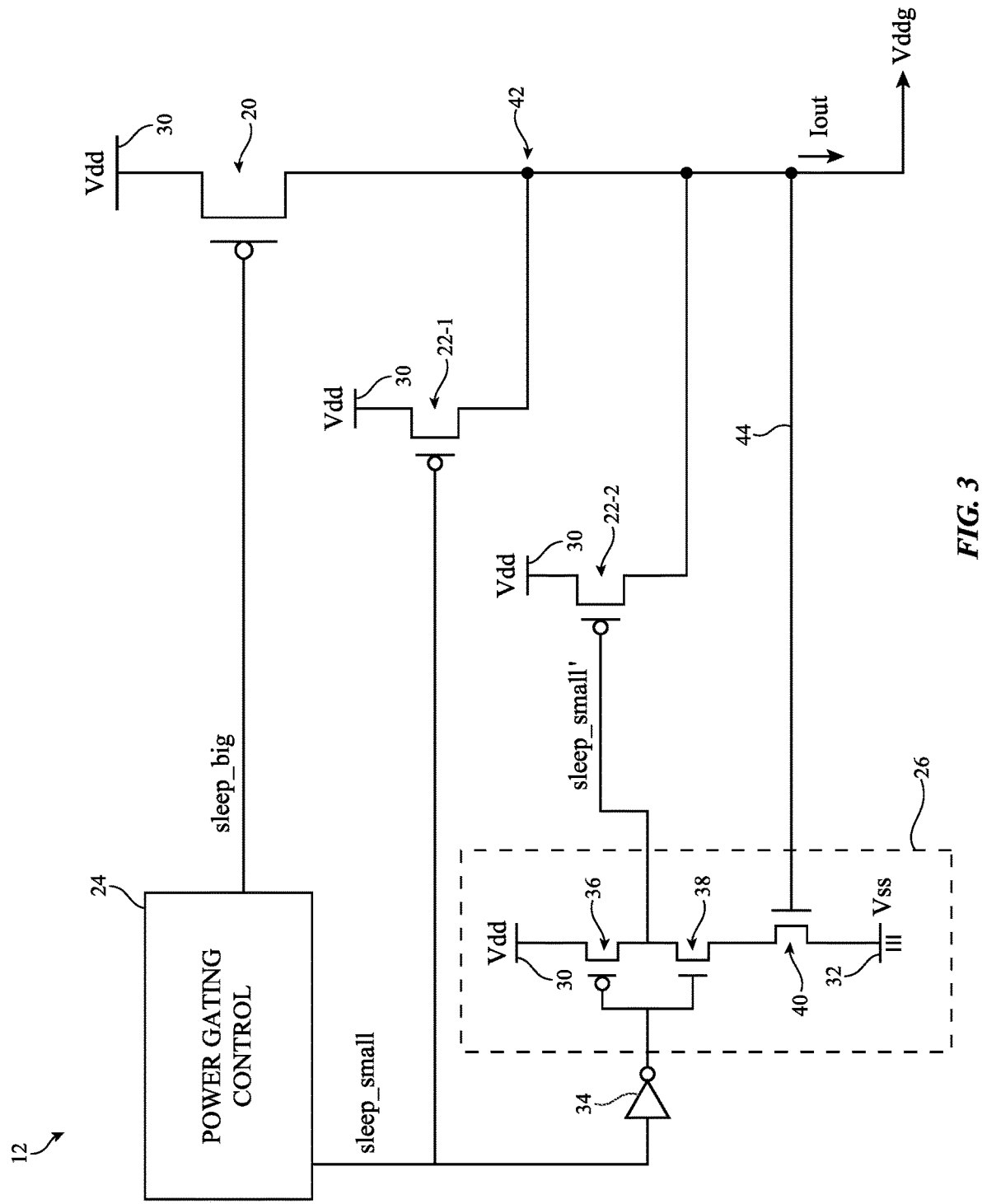
FIG. 3 is a circuit diagram showing one illustrative implementation of power switching circuitry in accordance with some embodiments.

FIG. 3 is a circuit diagram showing one illustrative implementation of power switching circuitry 12 in accordance with some embodiments. As shown in FIG. 3, power switching circuitry 12 may include a primary power switch such as primary power transistor 20, a plurality of auxiliary (secondary) power switches such as auxiliary power transistors 22-1 and 22-2, a voltage detection circuit such as voltage detector 26, and a power gating control circuit such as power gating controller 24. Primary power switch 20 may be a pull-up transistor such as a p-channel transistor (e.g., a p-type metal-oxide-semiconductor or PMOS transistor) having a source terminal coupled to a positive power supply line 30 (e.g., a positive power supply terminal on which external power supply voltage Vdd is provided), a drain terminal coupled to node 42, and a gate terminal configured to receive control signal sleep_big from power gating controller 24.

The terms "source" and "drain" are sometimes used interchangeably when referring to current-conducting terminals of a metal-oxide-semiconductor transistor. The source and drain terminals are therefore sometimes referred to as "source-drain" terminals (e.g., a transistor has a gate terminal, a first source-drain terminal, and a second source-drain terminal). Power gating controller 24 may deassert signal sleep_big (e.g., drive sleep_big high) to turn off primary power transistor 20 and may assert signal sleep_big (e.g., drive sleep_big low) to turn on primary power transistor 20. An internal power supply voltage Vddg can be provided at node 42. Internal power supply voltage Vddg that is selectively connected to the external power supply line via the primary and secondary power switches is sometimes referred to herein as a gated power supply voltage or a virtual power supply voltage. Node 42 on which gated power supply voltage Vddg is provided is sometimes referred to as an output terminal of power switching circuitry 12.

Auxiliary power switch 22-1 may be a pull-up transistor such as a p-channel transistor (e.g., a PMOS transistor) having a source terminal coupled to positive power supply line 30, a drain terminal also coupled to output node 42, and a gate terminal configured to receive control signal sleep_small from power gating controller 24. Power gating controller 24 may deassert signal sleep_small (e.g., drive sleep_small high) to turn off auxiliary power transistor 22-1 and may assert signal sleep_small (e.g., drive sleep_small low) to turn on auxiliary power transistor 22-1.

Auxiliary power switch 22-2 may be a pull-up transistor such as a p-channel transistor (e.g., a PMOS transistor) having a source terminal coupled to positive power supply line 30, a drain terminal also coupled to output node 42, and a gate terminal configured to receive control signal sleep_small' from power gating controller 24. Control signal sleep_small' may be generated using voltage detector 26 based on control signal sleep_small and the voltage level of Vddg provided over feedback path 44.

Voltage detector 26 may include a p-type transistor 36, a first n-type transistor 38, and a second n-type transistor 40 coupled in series between positive power supply line 30 and ground power supply line 32 (e.g., a ground line on which ground power supply voltage Vss is provided). Transistor 36 may have a source terminal coupled to positive power supply line 30, a drain terminal, and a gate terminal that is configured to receive an inverted version of control signal sleep_small via an inverter 34. Transistor 38 may have a drain terminal coupled to the drain terminal of transistor 36, a source terminal, and a gate terminal that is also configured to receive the inverted version of control signal sleep_small via inverter 34. Control signal sleep_small' that modulates transistor 22-2 is generated at the drain nodes of transistor 36 and 38. Transistor 40 may have a drain terminal coupled to the source terminal of transistor 38, a source terminal coupled to ground line 32, and a gate terminal configured to receive gated power supply voltage Vddg via feedback path 44.

Configured in this way, voltage detector 26 may monitor the voltage level of Vddg and may only assert control signal sleep_small' to turn on corresponding auxiliary power transistor 22-2 when Vddg exceeds a certain threshold. Auxiliary power transistor 22-1 should be sized small enough to satisfy inrush current requirements while being large enough to pull Vddg above the threshold level of voltage detector 26. Auxiliary power transistor 22-2 should be sized small enough to satisfy inrush current requirements while being large enough to help pull Vddg to more than 60% of Vdd, to more than 70% of Vdd, to more than 80% of Vdd, or to more than 90% of Vdd.

Voltage detector 26 of FIG. 3 may, as an example, be configured to assert signal sleep_small' (e.g., drive sleep_small' low) when Vddg exceeds 50% of external power supply Vdd. This is merely illustrative. As another example, voltage detector 26 can be configured to assert signal sleep_small' in response to Vddg rising above 40% of Vdd. As another example, voltage detector 26 can be configured to assert signal sleep_small' in response to Vddg rising above 30% of Vdd. As another example, voltage detector 26 can be configured to assert signal sleep_small' in response to Vddg rising above 60% of Vdd. As another example, voltage detector 26 can be configured to assert signal sleep_small' in response to Vddg rising above 70% of Vdd. As another example, voltage detector 26 can be configured to assert signal sleep_small' in response to Vddg rising above a selected threshold equal to 20-80% of Vdd.

Pull-down transistor 40, although shown as a single transistor, can be implemented using a plurality of stacked transistors connected in series. The threshold (sometimes referred to as the "trip point" or "trigger point") of voltage detector 26 can be tuned by adjusting the number of stacked transistors within transistor 40. The use of more stacked transistors within pull-down device 40 can increase the threshold level of voltage detector 26, whereas the use of fewer stacked transistors within pull-down device 40 can lower the threshold level of voltage detector 26. If desired, the number of stacked transistors within pull-down device 40 may be statically set or dynamically adjusted. Control signals sleep_big and sleep_small (and also sleep_small') can be set to a high voltage level during sleep mode so that all of the power switches 20 and 22 are turned off. Control signals sleep_big and sleep_small (and also sleep_small') are therefore sometimes referred to as sleep control signals.

The use of p-type transistors for power switches 20, 22-1, and 22-2 in the example of FIG. 3 is merely illustrative. If desired, the primary and/or auxiliary power switches can alternatively be implemented using n-type transistors without departing from the spirit of the present embodiments.

Figure 4:
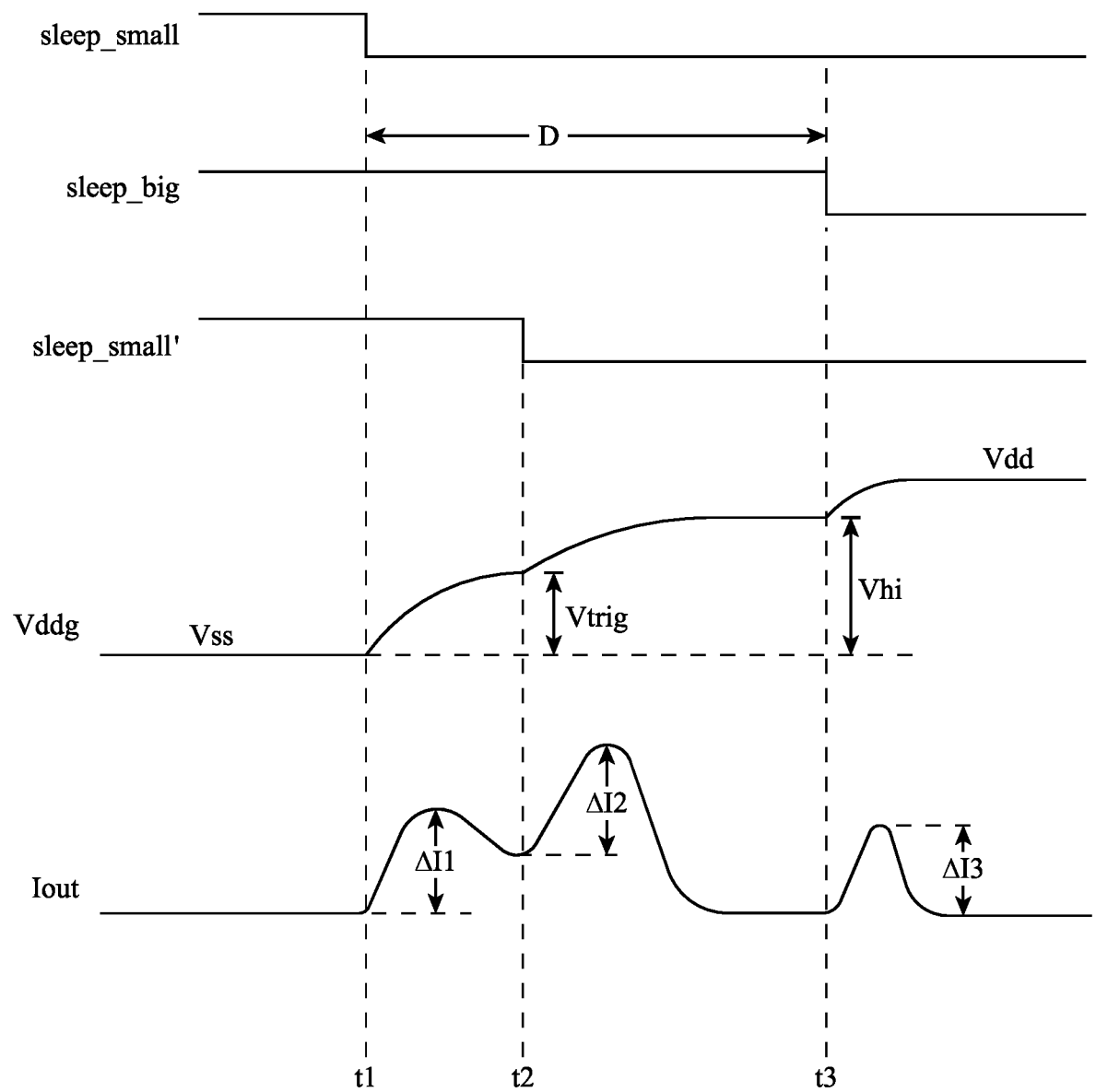
FIG. 4 is a timing diagram showing illustrative waveforms involved in the operation of power switching circuitry of the type shown in FIG. 3 in accordance with some embodiments.

FIG. 4 is a timing diagram showing illustrative waveforms involved in the operation of power switching circuitry 12 of the type shown in FIG. 3 during a device power-on event. Current Iout may represent the amount of current provided by power switching circuitry 12 and flowing through output node 42. Prior to time t1, all of the sleep control signals sleep_small, sleep_big, and sleep_small' are deasserted during a sleep mode (sometimes referred to as a sleep or idle phase). At time t1, the power control logic may assert (e.g., drive low) control signal sleep_small. Asserting signal sleep_small may activate auxiliary power switch 22-1 so that the gated power supply voltage Vddg begins charging up from the ground level Vss. During this time period from t1 to t2, power switching circuitry 12 may see a small output current peak of ΔI1.

At time t2, feedback voltage Vddg may exceed the threshold (e.g., trip point Vtrip) of the voltage detector. In response to Vddg exceeding threshold level Vtrip, the voltage detector may assert (e.g., drive low) control signal sleep_small'. Asserting signal sleep_small' may activate additional auxiliary power switch 22-2 so that the gated power supply voltage Vddg can charge up faster towards target power supply voltage Vdd. During this time period from t2 to t3, power switching circuitry 12 may see a small output current peak of ΔI2. By the end of t3, auxiliary power transistor 22-1 and 22-2 should be able to charge Vddg to a high voltage level Vhi that is at least 60% of Vdd, at least 70% of Vdd, at least 80% of Vdd, or at least 90% of Vdd.

At time t3, the power gating control logic may assert (e.g., drive low) signal sleep_big. The amount of time delay (labeled D in FIG. 4) from t1 to t3 may be a fixed or predetermined delay. Asserting signal sleep_big may finally activate primary power switch 20 so that the gated power supply voltage Vddg can be charged equal to power supply voltage Vdd. During this time period following t3, power switching circuitry 12 may see a small output current peak of ΔI3. As shown in the example of FIG. 4, the use of multiple auxiliary power switches at least some of which is modulated using a feedback control scheme to automatically turn them on at different times ensures that each separate current peak or surge is kept at tolerable levels.

Figure 5:
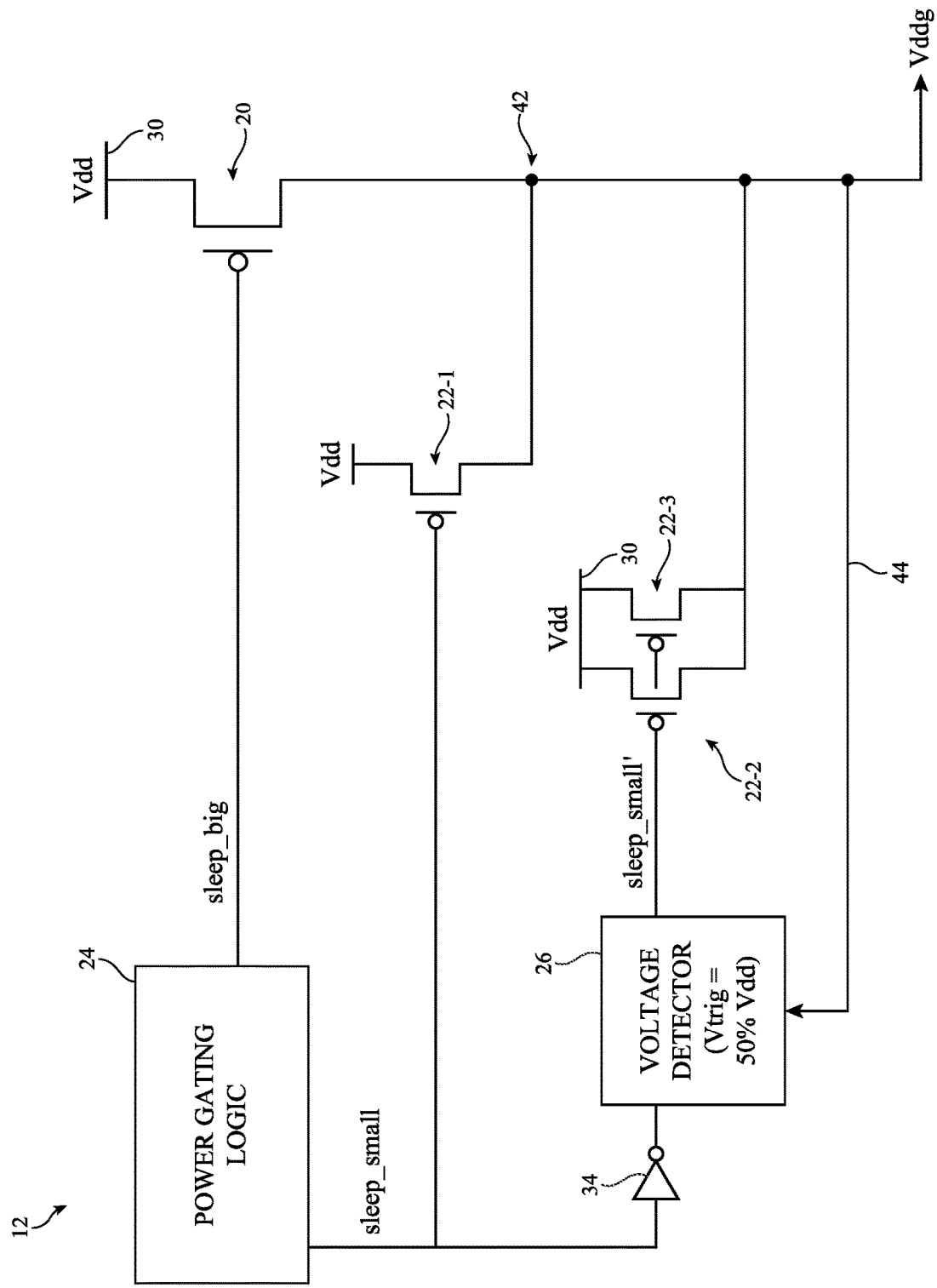
FIG. 5 is a circuit diagram showing illustrative power switching circuitry having a feedback path for turning on additional auxiliary switches in response to detecting that a gate power supply voltage exceeds a given threshold in accordance with some embodiments.

In the example of FIG. 3, auxiliary power transistors 22-1 and 22-2 may be the same size. This is merely illustrative. FIG. 5 shows another example of power switching circuitry 12 in which voltage detector 26 outputs a signal sleep_small' that simultaneously controls auxiliary power transistors 22-2 and 22-3. Both auxiliary power transistors 22-2 and 22-3 may be pull-up (e.g., PMOS) switches coupled between power supply line 30 and output node 42. As an example, transistors 22-1, 22-2, and 22-3 may all be the same size. As another example, transistors 22-2 and 22-3 can each be larger than transistor 22-1. Transistors 22-2 and 22-3 can be the same size or can be different sizes. The use of additional or larger auxiliary power transistors 22-2 and 22-3 can help increase the pull-up (charging) speed of Vddg from time t2 to t3 (see, e.g., FIG. 4).

In FIG. 5, voltage detector 26 is shown as being configured with a trip/trigger threshold equal to 50% of Vdd. This is also merely exemplary. As another example, voltage detector 26 can be configured to assert signal sleep_small' in response to Vddg rising above 25% of Vdd. As another example, voltage detector 26 can be configured to assert signal sleep_small' in response to Vddg rising above 45% of Vdd. As another example, voltage detector 26 can be configured to assert signal sleep_small' in response to Vddg rising above 60% of Vdd. As another example, voltage detector 26 can be configured to assert signal sleep_small' in response to Vddg rising above 75% of Vdd. As another example, voltage detector 26 can be configured to assert signal sleep_small' in response to Vddg rising above a selected threshold equal to 20-80% of Vdd.

The example of FIG. 5 showing a pair of auxiliary transistors 22-2 and 22-3 being controlled by a feedback-based voltage detector 26 is illustrative. In other embodiments, one or more feedback-based voltage detector 26 may control three or more auxiliary power transistors coupled in parallel between power supply line 30 and output node 42, five or more auxiliary power transistors coupled in parallel between power supply line 30 and output node 42, eight or more auxiliary power transistors coupled in parallel between power supply line 30 and output node 42, or ten or more auxiliary power transistors coupled in parallel between power supply line 30 and output node 42.

Figure 6:
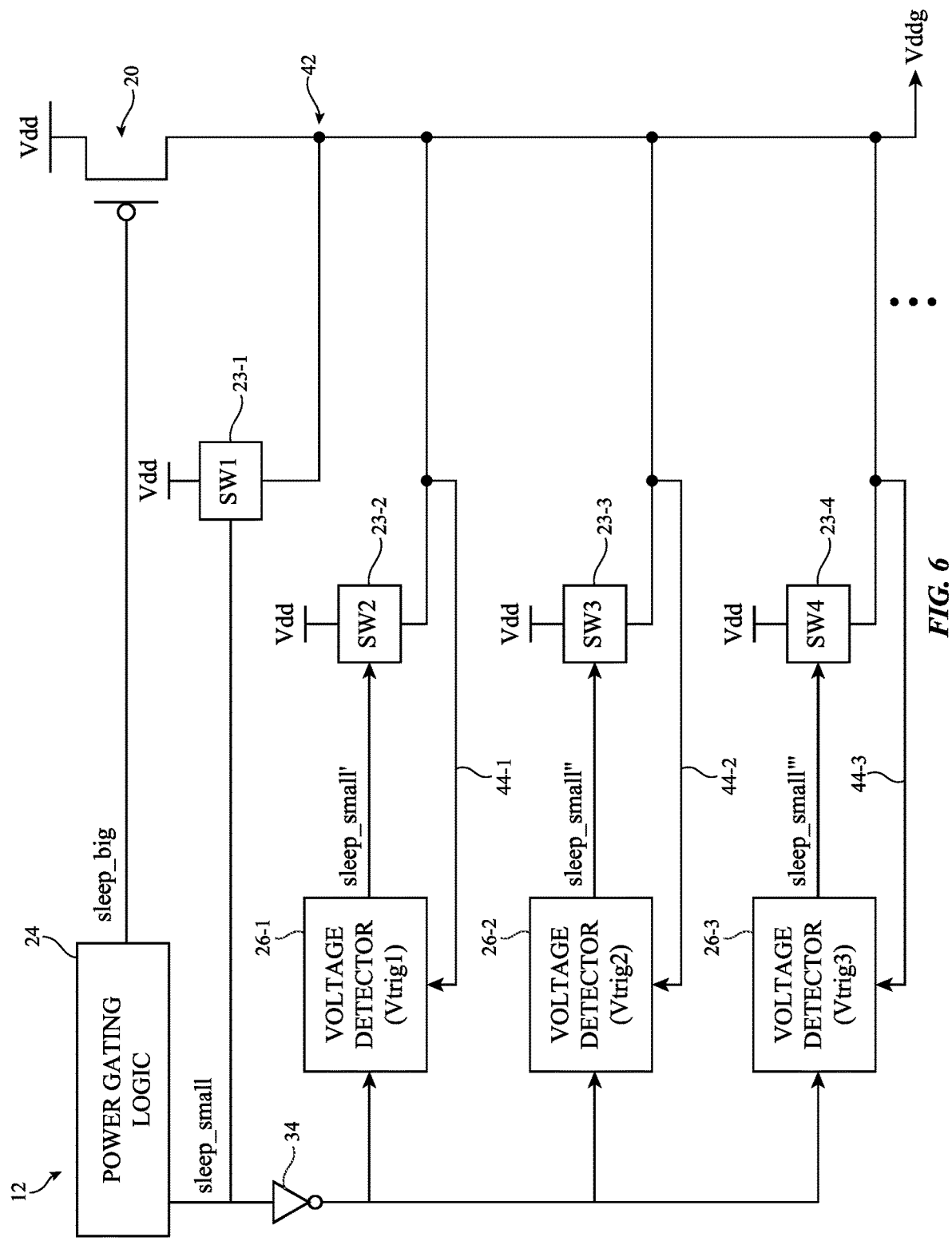
FIG. 6 is a circuit diagram showing illustrative power switching circuitry having multiple feedback paths for activating different sets of auxiliary switches in response to detecting that a gate power supply voltage exceeds various thresholds in accordance with some embodiments.

The embodiments of FIGS. 3 and 5 showing one voltage detector 26 having a threshold is illustrative and is not intended to limit the scope of the present embodiments. FIG. 6 shows another embodiment of power switching circuitry 12 having multiple voltage detection circuits. As shown in FIG. 6, power switching circuitry 12 may include a primary power switch such as primary power transistor 20, a plurality of auxiliary (secondary) power switches such as auxiliary power switches 23-1, 23-2, 23-3, and 23-4, voltage detection circuits such as voltage detector 26-1, voltage detector 26-2, voltage detector 26-3, and voltage detector 26-4, and a power gating control circuit such as power gating controller 24. Primary power switch 20 may be a pull-up transistor such as a p-channel transistor (e.g., a PMOS transistor) having a source terminal coupled to a positive power supply line 30 (e.g., a positive power supply terminal on which external power supply voltage Vdd is provided), a drain terminal coupled to output node 42, and a gate terminal configured to receive control signal sleep_big from power gating controller 24. Power gating controller 24 may deassert signal sleep_big (e.g., drive sleep_big high) to turn off primary power transistor 20 and may assert signal sleep_big (e.g., drive sleep_big low) to turn on primary power transistor 20. The gated (internal) power supply voltage Vddg can be provided at node 42.

Each of the auxiliary power switches 23 may include one or more pull-up transistors. For example, auxiliary power switch 23-1 may include one or more pull-up transistors, auxiliary power switch 23-2 may include one or more pull-up transistors, auxiliary power switch 23-3 may include one or more pull-up transistors, and auxiliary power switch 23-4 may include one or more pull-up transistors. Power gating controller 24 may deassert signal sleep_small (e.g., drive sleep_small high) to turn off auxiliary power switch 23-1 and may assert signal sleep_small (e.g., drive sleep_small low) to turn on auxiliary power switch 23-1.

The additional power switches 23-2, 23-3, and 23-4 may be controlled by multiple voltage detectors 26 each having a different threshold value. In FIG. 6, auxiliary power switch 23-2 may be configured to receive control signal sleep_small' from a first voltage detector 26-1. First voltage detector 26-1 may receive Vddg via a first feedback path 44-1, may receive an inverted version of signal sleep_small via inverter 34, and generate a corresponding control signal sleep_small' that is asserted only when Vddg exceeds a first threshold (e.g., when Vddg is greater than or equal to a first trip/trigger voltage level Vtrig1).

Similarly, auxiliary power switch 23-3 may be configured to receive control signal sleep_small" from a second voltage detector 26-2. Second voltage detector 26-2 may receive Vddg via a second feedback path 44-2, may receive an inverted version of signal sleep_small via inverter 34, and generate a corresponding control signal sleep_small" that is asserted only when Vddg exceeds a second threshold (e.g., when Vddg is greater than or equal to a second trip/trigger voltage level Vtrig2). Lastly, auxiliary power switch 23-4 may be configured to receive control signal sleep_small''' from a third voltage detector 26-3. Third voltage detector 26-3 may receive Vddg via a third feedback path 44-3, may receive an inverted version of signal sleep_small via inverter 34, and generate a corresponding control signal sleep_small''' that is asserted only when Vddg exceeds a third threshold (e.g., when Vddg is greater than or equal to a third trip/trigger voltage level Vtrig3).

Threshold voltages Vtrig1, Vtrig2, and Vtrig3 can all be different from one another. As an example, Vtrig1 can be less than Vtrig2, which can be less than Vtrig3. For instance, Vtrig1 may be set equal to 25% of Vdd, Vtrig2 may be set equal to 50% of Vdd, and Vtrig3 might be set equal to 75% of Vdd. In these examples, auxiliary switch 23-2 may first be activated after switch 23-1, which can then be followed by the activation of auxiliary switch 23-3, which can then finally be followed by the activation of auxiliary switch 23-4. The example of FIG. 6 showing three feedback-based voltage detectors for controlling three different sets of auxiliary power switches 23 is illustrative. If desired, power switching circuitry 12 can include two voltage detectors configured to selectively activate two different sets of auxiliary power switches based on two different threshold levels, four voltage detectors configured to selectively activate four different sets of auxiliary power switches based on four different threshold levels, or more than four voltage detectors having four different associated threshold (trigger) levels.

Figure 7:
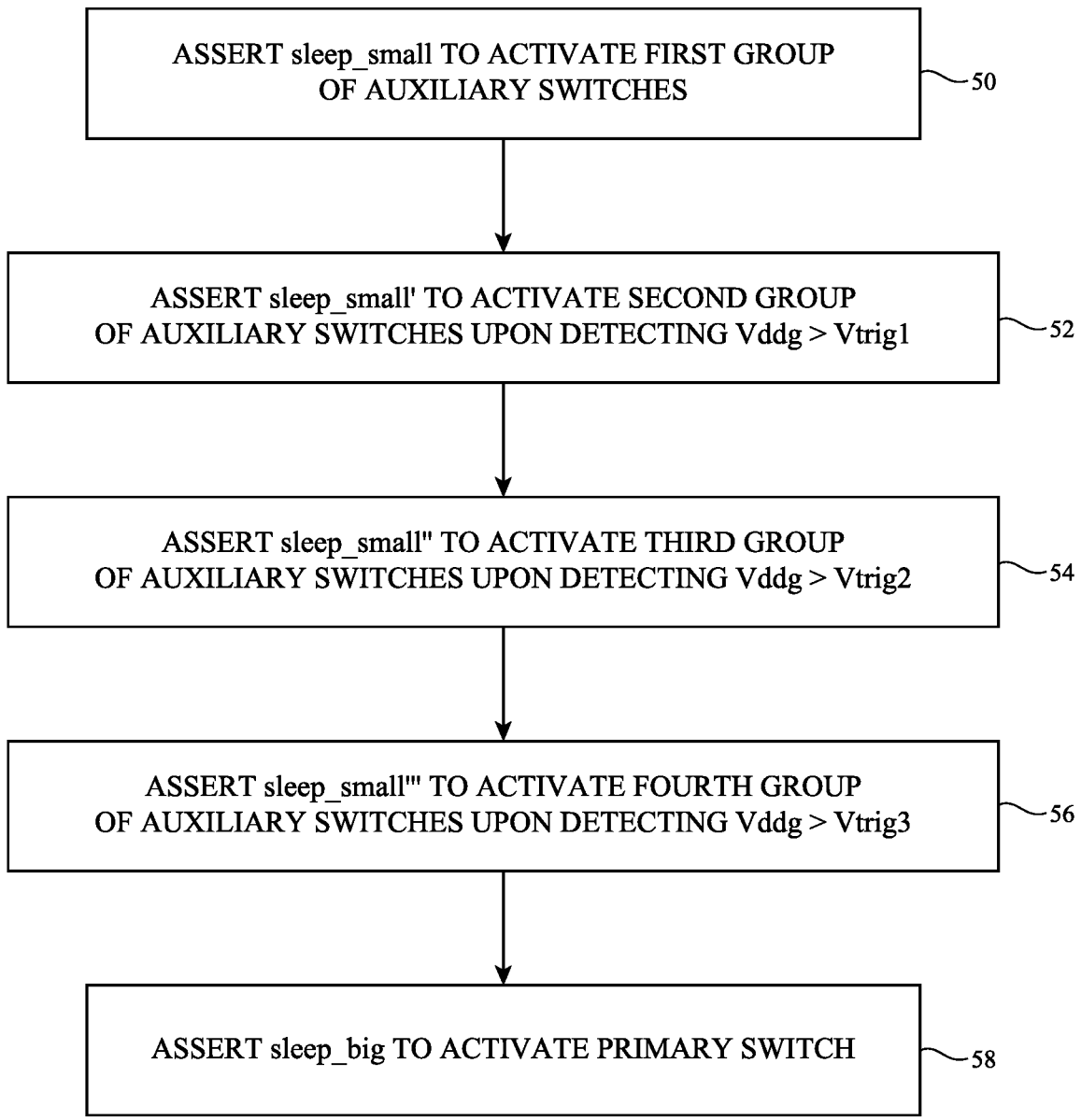
FIG. 7 is a flow chart of illustrative steps involved in operating power switching circuitry of the type shown in FIG. 6 in accordance with some embodiments.

FIG. 7 is a flow chart of illustrative steps involved in operating power switching circuitry 12 of the type shown in FIG. 6. During the operations of block 50, the power gating logic may assert control signal sleep_small to selectively turn on (activate) the first group of auxiliary power switches (e.g., switch 23-1 containing one or more pull-up transistors).

During the operations of block 52, voltage detector 26-1 may assert control signal sleep_small' to selectively turn on (activate) the second group of auxiliary power switches (e.g., switch 23-2 containing one or more pull-up transistors) in response to detecting that gated power supply voltage Vddg is greater than first threshold voltage Vtrig1. Voltage detector 26-1 may monitor supply voltage Vddg via first feedback path 44-1.

During the operations of block 54, voltage detector 26-2 may assert control signal sleep_small" to selectively turn on (activate) the third group of auxiliary power switches (e.g., switch 23-3 containing one or more pull-up transistors) in response to detecting that gated power supply voltage Vddg is greater than second threshold voltage Vtrig2. Voltage detector 26-2 may monitor supply voltage Vddg via second feedback path 44-2. In this example, Vtrig2 is greater than Vtrig1.

During the operations of block 56, voltage detector 26-3 may assert control signal sleep_small'" to selectively turn on (activate) the fourth group of auxiliary power switches (e.g., switch 23-4 containing one or more pull-up transistors) in response to detecting that gated power supply voltage Vddg is greater than third threshold voltage Vtrig3. In this example, Vtrig3 is greater than Vtrig2. Voltage detector 26-3 may monitor supply voltage Vddg via third feedback path 44-3. If desired, additional voltage detector(s) that control separate auxiliary power switches can be included.

During the operations of block 58, the power gating logic may assert control signal sleep_big to selectively turn on (activate) the primary power switch 20. Primary power switch 20 may be formed using one large transistor or a plurality of smaller pull-up transistors coupled together in parallel. Primary power switch 20 may be configured to charge gated power supply voltage all the way up to the target positive power supply voltage Vdd.

The foregoing is merely illustrative and various modifications can be made to the described embodiments. The foregoing embodiments may be implemented individually or in any combination.

What is claimed is:

1. Power switching circuitry comprising:
a primary power switch coupled to an output node;
a first auxiliary power switch coupled to the output node;
a second auxiliary power switch coupled to the output node; and
a voltage detection circuit configured to monitor a voltage at the output node and to selectively activate the second auxiliary power switch based on the monitored voltage, wherein the first auxiliary power switch is activated at a first point in time, wherein the second auxiliary power switch is activated at a second point in time after the first point in time, and wherein the primary power switch is activated at a third point in time after the second point in time.

2. The power switching circuitry of claim 1, wherein the first auxiliary power switch is smaller than the primary power switch and wherein the second auxiliary power switch is smaller than the primary power switch.

3. The power switching circuitry of claim 1, wherein the primary power switch comprises a first pull-up transistor having a first source-drain terminal coupled to a positive power supply line, a second source-drain terminal coupled to the output node, and a gate terminal configured to receive a first control signal.

4. The power switching circuitry of claim 3, wherein the first auxiliary power switch comprises a second pull-up transistor having a first source-drain terminal coupled to the positive power supply line, a second source-drain terminal coupled to the output node, and a gate terminal configured to receive a second control signal.

5. The power switching circuitry of claim 4, wherein the second auxiliary power switch comprises a third pull-up transistor having a first source-drain terminal coupled to the positive power supply line, a second source-drain terminal coupled to the output node, and a gate terminal configured to receive a third control signal.

6. The power switching circuitry of claim 5, further comprising:
a power gating control circuit configured to output the first and second control signals.

7. The power switching circuitry of claim 5, wherein the third control signal is output from the voltage detection circuit.

8. The power switching circuitry of claim 5, wherein the voltage detection circuit is configured to receive an inverted version of the second control signal via an inverter.

9. The power switching circuitry of claim 1, wherein the voltage detection circuit is configured to activate the second auxiliary power switch in response to detecting that the voltage at the output node exceeds a threshold.

10. The power switching circuitry of claim 1, further comprising:
a third auxiliary power switch coupled to the output node; and
a first additional voltage detection circuit configured to selectively activate the third auxiliary power switch.

11. The power switching circuitry of claim 10, wherein the voltage detection circuit is configured to activate the second auxiliary power switch in response to detecting that the voltage at the output node exceeds a first threshold.

12. The power switching circuitry of claim 11, wherein the first additional voltage detection circuit is configured to activate the third auxiliary power switch in response to detecting that the voltage exceeds a second threshold different than the first threshold.

13. The power switching circuitry of claim 10, further comprising:
a control circuit configured to generate a first control signal for controlling the primary power switch and to generate a second control signal for controlling the first auxiliary power switch.

14. The power switching circuitry of claim 10, further comprising:
a fourth auxiliary power switch configured to charge up the voltage at the output node; and
a second additional voltage detection circuit configured to activate the fourth auxiliary power switch, wherein the first, second, third, and fourth auxiliary power switches are activated at different times.

15. A method of operating power switching circuitry, comprising:
- activating a first auxiliary power switch to charge up a gated voltage;
- detecting whether the gated voltage exceeds a threshold;
- in response to detecting the gated voltage exceeding the threshold, activating a second auxiliary power switch to charge up the gated voltage; and
- subsequent to activating the second auxiliary power switch, activating a primary power switch to charge the gated voltage to a positive power supply voltage.

16. The method of claim 15, wherein the first auxiliary power switch is smaller than the primary power switch and wherein the second auxiliary power switch is smaller than the primary power switch.

17. The method of claim 15, further comprising:
- using a voltage detector to detect whether the gated voltage exceeds the threshold; and
- using the voltage detector to output a control signal to the second auxiliary power switch.

18. The method of claim 17, wherein the first auxiliary power switch is not controlled by the voltage detector.

19. The method of claim 15, further comprising:
- with power gating control logic, outputting a first control signal to the primary power switch; and
- with the power gating control logic, outputting a second control signal to the first auxiliary power switch.

20. The method of claim 19, wherein the power gating control logic is configured to assert the first control signal a fixed delay period after assertion of the second control signal.

* * * * *